(12) United States Patent
Lei

(10) Patent No.: US 6,718,126 B2
(45) Date of Patent: Apr. 6, 2004

(54) APPARATUS AND METHOD FOR VAPORIZING SOLID PRECURSOR FOR CVD OR ATOMIC LAYER DEPOSITION

(75) Inventor: Lawrence C. Lei, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 09/953,451

(22) Filed: Sep. 14, 2001

(65) Prior Publication Data

US 2003/0053799 A1 Mar. 20, 2003

(51) Int. Cl.[7] .......................... C23C 14/00; C23C 16/00
(52) U.S. Cl. .................................. 392/388; 427/255.23
(58) Field of Search .......................... 392/386, 388, 392/389, 390; 118/724, 726; 427/248.1, 255.23, 255.25, 592, 593

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,834,831 A | 5/1989 | Nishizawa et al. | 156/611 |
| 4,993,357 A | 2/1991 | Scholz | 118/715 |
| 5,225,366 A | 7/1993 | Yoder | 437/108 |
| 5,281,274 A | 1/1994 | Yoder | 118/697 |
| 5,294,286 A | 3/1994 | Nishizawa et al. | 156/610 |
| 5,374,570 A | 12/1994 | Nasu et al. | 437/40 |
| 5,377,429 A | 1/1995 | Sandhu et al. | |
| 5,441,703 A | 8/1995 | Jurgensen | 422/129 |
| 5,443,647 A | 8/1995 | Aucoin et al. | 118/723 |
| 5,447,569 A | 9/1995 | Hiskes et al. | |
| 5,480,818 A | 1/1996 | Matsumoto et al. | 437/40 |
| 5,483,919 A | 1/1996 | Yokoyama et al. | 117/89 |
| 5,503,875 A | 4/1996 | Imai et al. | 427/255.3 |
| 5,674,574 A | 10/1997 | Atwell et al. | |
| 5,674,786 A | 10/1997 | Turner et al. | 437/225 |
| 5,711,811 A | 1/1998 | Suntola et al. | 118/711 |
| 5,796,116 A | 8/1998 | Nakata et al. | 257/66 |
| 5,807,792 A | 9/1998 | Ilg et al. | 438/758 |

(List continued on next page.)

FOREIGN PATENT DOCUMENTS

| | | | |
|---|---|---|---|
| EP | 1 167 569 | 1/2002 | C23C/16/455 |
| GB | 2 355 727 | 5/2001 | C23C/126/44 |
| JP | 58097917 | 6/1983 | H03J/7/02 |
| JP | 4291916 | 9/1992 | C23C/16/48 |
| JP | 5047666 | 2/1993 | H01L/21/205 |
| JP | 5206036 | 8/1993 | H01L/21/205 |

(List continued on next page.)

OTHER PUBLICATIONS

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

(List continued on next page.)

*Primary Examiner*—Sang Paik
(74) *Attorney, Agent, or Firm*—Moser, Patterson & Sheridan, LLP

(57) ABSTRACT

An apparatus and method for effectively and controllably vaporizing a solid precursor material is provided. In particular, the present invention provides an apparatus that includes a housing defining a sealed interior volume having an inlet for receiving a carrier gas, at least one surface within the housing for the application of a solid precursor, and a heating member for heating the solid precursor. The heating member can be located in the housing or in the surface within the housing. The surface can be a rod, baffle, mesh, or grating, and is preferably s-shaped or cone-shaped. Optionally, an outlet connects the housing to a reaction chamber. A method for vaporizing a solid precursor using the apparatus of the present invention is also provided.

7 Claims, 3 Drawing Sheets

U.S. PATENT DOCUMENTS

| | | | |
|---|---|---|---|
| 5,835,677 A | 11/1998 | Li et al. .................... 392/401 |
| 5,855,680 A | 1/1999 | Soininen et al. ............ 118/719 |
| 5,879,459 A | 3/1999 | Gadgil et al. ............... 118/715 |
| 5,916,365 A | 6/1999 | Sherman ...................... 117/92 |
| 5,923,056 A | 7/1999 | Lee et al. .................... 257/192 |
| 6,015,590 A | 1/2000 | Suntola et al. ......... 427/255.23 |
| 6,015,917 A | 1/2000 | Bhandari et al. ............. 556/12 |
| 6,042,652 A | 3/2000 | Hyun et al. .................. 118/719 |
| 6,072,939 A | 6/2000 | Atwell |
| 6,084,302 A | 7/2000 | Sandhu ....................... 257/751 |
| 6,124,158 A | 9/2000 | Dautartas et al. ............ 438/216 |
| 6,139,700 A | 10/2000 | Kang et al. ............ 204/192.17 |
| 6,144,060 A | 11/2000 | Park et al. ................... 257/310 |
| 6,174,377 B1 | 1/2001 | Doering et al. .............. 118/729 |
| 6,174,809 B1 | 1/2001 | Kang et al. .................. 438/682 |
| 6,183,563 B1 | 2/2001 | Choi et al. ................... 118/715 |
| 6,197,683 B1 | 3/2001 | Kang et al. .................. 438/643 |
| 6,200,893 B1 | 3/2001 | Sneh ........................... 438/685 |
| 6,203,613 B1 | 3/2001 | Gates et al. ................. 117/104 |
| 6,207,487 B1 | 3/2001 | Kim et al. ................... 438/238 |
| 6,231,672 B1 | 5/2001 | Choi et al. ................... 118/715 |
| 6,270,572 B1 | 8/2001 | Kim et al. ..................... 117/93 |
| 6,270,839 B1 * | 8/2001 | Onoe et al. ............... 427/248.1 |
| 6,284,646 B1 | 9/2001 | Leem ........................... 438/629 |
| 6,287,965 B1 | 9/2001 | Kang et al. .................. 438/648 |
| 6,305,314 B1 | 10/2001 | Sneh et al. .................. 118/723 |
| 6,306,216 B1 | 10/2001 | Kim et al. ................... 118/725 |
| 6,342,277 B1 | 1/2002 | Sherman ..................... 427/562 |
| 6,348,376 B2 | 2/2002 | Lim et al. .................... 438/253 |
| 6,358,829 B2 | 3/2002 | Yoon et al. .................. 438/597 |
| 6,372,598 B2 | 4/2002 | Kang et al. .................. 438/399 |
| 6,379,748 B1 | 4/2002 | Bhandari et al. ...... 427/255.394 |
| 6,391,785 B1 | 5/2002 | Satta et al. ................... 438/704 |
| 6,399,491 B2 | 6/2002 | Jeon et al. ................... 438/680 |
| 6,416,577 B1 | 7/2002 | Suntoloa et al. .............. 117/88 |
| 6,424,800 B1 * | 7/2002 | Kim ............................ 392/388 |
| 6,447,607 B2 | 9/2002 | Soininen et al. ............. 117/200 |
| 6,451,119 B2 | 9/2002 | Sneh et al. .................. 118/715 |
| 6,451,695 B2 | 9/2002 | Sneh ........................... 438/685 |
| 6,468,924 B2 | 10/2002 | Lee et al. .................... 438/763 |
| 6,475,276 B1 | 11/2002 | Elers et al. ................... 117/84 |
| 6,475,910 B1 | 11/2002 | Sneh ........................... 438/685 |
| 6,478,872 B1 | 11/2002 | Chae et al. .................... 117/88 |
| 6,481,945 B1 | 11/2002 | Hasper et al. ................ 414/217 |
| 6,482,262 B1 | 11/2002 | Elers et al. ................... 117/84 |
| 6,482,733 B2 | 11/2002 | Raaijmakers et al. ........ 438/633 |
| 6,511,539 B1 | 1/2003 | Raaijmakers ................ 117/102 |
| 6,551,406 B2 | 4/2003 | Kilpi ........................... 118/728 |
| 2001/0000866 A1 | 5/2001 | Sneh et al. .................. 118/723 |
| 2001/0002280 A1 | 5/2001 | Sneh ....................... 427/255.28 |
| 2001/0009140 A1 | 7/2001 | Bondestam et al. ......... 118/725 |
| 2001/0009695 A1 | 7/2001 | Saanila et al. ........... 427/255.39 |
| 2001/0011526 A1 | 8/2001 | Doering et al. .............. 118/729 |
| 2001/0013312 A1 | 8/2001 | Soininen et al. .............. 117/86 |
| 2001/0014371 A1 | 8/2001 | Kilpi ....................... 427/255.28 |
| 2001/0024387 A1 | 9/2001 | Raaijmakers et al. ........ 365/200 |
| 2001/0025979 A1 | 10/2001 | Kim et al. ................... 257/315 |
| 2001/0028924 A1 | 10/2001 | Sherman ................ 427/255.28 |
| 2001/0034123 A1 | 10/2001 | Jeon et al. ................... 438/643 |
| 2001/0041250 A1 | 11/2001 | Werkhoven et al. ......... 428/212 |
| 2001/0042523 A1 | 11/2001 | Kesala ........................ 122/6.6 |
| 2001/0042799 A1 | 11/2001 | Kim et al. ................... 239/553 |
| 2001/0054377 A1 | 12/2001 | Lindfors et al. ............. 117/104 |
| 2001/0054730 A1 | 12/2001 | Kim et al. ................... 257/301 |
| 2001/0054769 A1 | 12/2001 | Raaijakers et al. .......... 257/758 |
| 2002/0000196 A1 | 1/2002 | Park ............................ 118/715 |
| 2002/0000598 A1 | 1/2002 | Kang et al. .................. 257/301 |
| 2002/0007790 A1 | 1/2002 | Park ............................ 118/715 |
| 2002/0020869 A1 | 2/2002 | Park et al. ................... 257/306 |
| 2002/0021544 A1 | 2/2002 | Cho et al. .................... 361/200 |
| 2002/0031618 A1 | 3/2002 | Sherman ..................... 427/569 |
| 2002/0041931 A1 | 4/2002 | Suntola et al. .......... 427/255.28 |
| 2002/0048635 A1 | 4/2002 | Kim et al. ................... 427/331 |
| 2002/0052097 A1 | 5/2002 | Park ............................ 438/507 |
| 2002/0076507 A1 | 6/2002 | Chiang et al. ............... 427/569 |
| 2002/0076837 A1 | 6/2002 | Hujanen et al. ................ 438/3 |
| 2002/0086106 A1 | 7/2002 | Park et al. ................. 427/248.1 |
| 2002/0092471 A1 | 7/2002 | Kang et al. .................. 118/715 |
| 2002/0094689 A1 | 7/2002 | Park ............................ 438/694 |
| 2002/0098627 A1 | 7/2002 | Pomarede et al. ........... 438/149 |
| 2002/0106536 A1 | 8/2002 | Lee et al. .................... 428/702 |
| 2002/0108570 A1 | 8/2002 | Lindfors ...................... 118/715 |
| 2002/0134307 A1 | 9/2002 | Choi ........................... 118/715 |
| 2002/0155722 A1 | 10/2002 | Satta et al. .................. 438/704 |
| 2002/0162506 A1 | 11/2002 | Sneh et al. .................. 118/715 |
| 2002/0177282 A1 | 11/2002 | Song .......................... 438/300 |
| 2002/0182320 A1 | 12/2002 | Leskela et al. .............. 427/250 |
| 2002/0187256 A1 | 12/2002 | Elers et al. .................... 427/99 |
| 2003/0004723 A1 | 1/2003 | Chihara ...................... 704/260 |
| 2003/0013320 A1 | 1/2003 | Kim et al. ................... 438/778 |
| 2003/0031807 A1 | 2/2003 | Elers et al. .................. 427/569 |
| 2003/0049942 A1 | 3/2003 | Haukka et al. .............. 438/778 |
| 2003/0072975 A1 | 4/2003 | Shero et al. ................. 428/704 |
| 2003/0075273 A1 | 4/2003 | Kilpela et al. .......... 156/345.33 |
| 2003/0075925 A1 | 4/2003 | Lindfors et al. ............. 285/367 |
| 2003/0082296 A1 | 5/2003 | Ellers et al. ................... 427/96 |

FOREIGN PATENT DOCUMENTS

| | | | |
|---|---|---|---|
| JP | 5234899 | 9/1993 | ......... H01L/21/205 |
| JP | 5270997 | 10/1993 | ........... C30B/29/68 |
| JP | 6224138 | 5/1994 | ........... C23C/16/00 |
| JP | 2000319772 | 3/2000 | ........... C23C/16/00 |
| JP | 2001020075 | 11/2000 | ........... C23C/16/44 |
| JP | 2001172767 | 6/2001 | ........... C23C/16/40 |
| JP | 2001111000 | 12/2002 | ........... H01L/29/00 |
| WO | WO 99/01595 | 1/1999 | ........... C30B/25/14 |
| WO | WO 96/17107 | 6/1999 | ........... C23C/16/44 |
| WO | WO 99/29924 | 6/1999 | ........... C23C/16/04 |
| WO | WO 99/65064 | 12/1999 | ........... H01L/21/00 |
| WO | WO 00/16377 | 3/2000 | |
| WO | WO 00/54320 | 9/2000 | ........... H01L/21/44 |
| WO | WO 00/79576 | 12/2000 | ......... H01L/21/205 |
| WO | WO 01/15220 | 3/2001 | ......... H01L/21/768 |
| WO | WO 01/17692 | 3/2001 | ........... B05C/11/00 |
| WO | WO 01/27346 | 4/2001 | ........... C23C/16/44 |
| WO | WO 01/27347 | 4/2001 | ........... C23C/16/44 |
| WO | WO 01/29280 | 4/2001 | ........... C23C/16/32 |
| WO | WO 01/29891 | 4/2001 | ......... H01L/21/768 |
| WO | WO 01/29893 | 4/2001 | ......... H01L/21/768 |
| WO | WO 01/36702 | 5/2001 | ........... C23C/16/00 |
| WO | WO 01/66832 | 9/2001 | ........... C30B/25/14 |
| WO | WO 02/08485 | 1/2002 | ........... C23C/16/00 |
| WO | WO 02/08488 | 1/2002 | ........... C23C/16/44 |
| WO | WO 02/43115 | 5/2002 | |
| WO | WO 02/45167 | 6/2002 | ........... H01L/27/00 |

OTHER PUBLICATIONS

Kukli, et al., "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236–42.

Kukli, et al., "Properties of Ta$_2$O$_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of {Nb$_{1-x}$Ta$_x$}$_2$O$_5$ Solid Solutions and {Nb$_{1-x}$Ta$_x$}$_2$O$_5$–ZrO$_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p2016–20.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

* cited by examiner

APPARATUS AND METHOD FOR VAPORIZING SOLID PRECURSOR FOR CVD OR ATOMIC LAYER DEPOSITION

BACKGROUND OF THE INVENTION

1. Field of the Invention

The present invention relates to the vaporization of solids. More particularly, the present invention relates to an apparatus and method for vaporizing solid precursors used in chemical vapor deposition and/or atomic layer deposition processes.

2. Background of the Technology

Chemical vapor deposition (CVD) and atomic layer deposition (ALD) are known techniques for forming solid films on a substrate by reaction of vapor phase chemicals near the surface of a substrate. In general, CVD and ALD techniques involve the delivery of gaseous reactants to the surface of a substrate where a chemical reaction takes place under temperature and pressure conditions favorable to the thermodynamics of the reaction. The type and composition of the layers that can be formed using CVD and/or ALD are limited by the ability to deliver the reactant(s) (otherwise known as precursor(s)) to the surface of the substrate. Various liquid precursors have been successfully used in CVD and/or ALD applications by delivering the liquid precursors in a carrier gas. Analogous attempts to deliver solid precursors to a CVD and/or an ALD reaction chamber have shown much less success.

In prior known solid precursor delivery devices, a carrier gas is passed through a heated container containing volatile solid precursor(s) at conditions conducive to vaporization of the solid. The carrier gas mixes with the vaporized solid and the vaporized solid is drawn from the container in a vacuum environment and carried with the carrier gas to the reaction chamber. Prior known solid precursor delivery procedures have been unsuccessful in reliably delivering solid precursor to the reaction chamber. For example, as the solid precursor is vaporized, the heat of vaporization needed to release the vaporized precursor molecules tends to cool underlying solid precursor molecules thus forming crystals, which tend to prevent or limit further vaporization of any underlying solid precursor.

Lack of control of solid precursor vaporization is, at least in part, due to the changing surface area of the bulk solid precursor as it is vaporized. Such a changing surface area when the bulk solid precursor is exposed to high temperature produces a continuously changing rate of vaporization, particularly for thermally sensitive compounds. This ever-changing rate of vaporization results in an inability to consistently contact the carrier gas with the solid material, which in turn results in a continuously changing and non-reproducible flow of vaporized solid precursor delivered for deposition in the reaction chamber. A predictable amount of precursor cannot therefore be delivered. As a result, film growth rate and composition of such films on substrates in the reaction chamber cannot be controlled adequately and effectively.

U.S. Pat. No. 5,447,569 discloses the use of a tube containing a plurality of longitudinal slits, wherein vaporization of solid material packed within the tube is controlled by moving the tube through a band of heaters, wherein the vaporized material exits the tube perpendicularly to the longitudinal axis of the tube via the slits.

U.S. Pat. No. 5,674,574 discloses the use of a rotatable surface contained within a container. The rotatable surface, which has solid precursor material applied thereon, is heated using a focused thermal beam as it rotates. The vaporized solid exits the container through an outlet and is delivered to a reaction chamber.

U.S. Pat. No. 6,072,939 discloses the use of a hollow tube-like container having a longitudinal axis passing through a first end. The hollow container is attached to an injector that is in communication with an inlet of a reaction chamber. The injector moves the hollow container through a heater that vaporizes the solid material contained therein.

As discussed above, prior art methods, which use of elaborate systems to vaporize the solid precursor, have numerous disadvantages. Acordingly, there is a need in the art for a simplified vapor delivery system for delivering solid precursors at a highly controllable rate without decomposition of the solid precursors during vaporization. There is a further need in the art to both easily and efficiently vaporize a solid precursor at a controlled rate such that a reproducible flow of vaporized solid precursor can be delivered to the reaction chamber.

The present invention is directed to an apparatus and method for vaporizing solid precursors that overcomes the problems of the prior art so as to provide a simple, more efficient apparatus and method for vaporizing solid precursors in the formation of thin layers on substrates.

SUMMARY OF THE INVENTION

The present invention provides an apparatus for vaporizing solid precursors. The apparatus includes a housing defining a sealed interior volume having an inlet for receiving a carrier gas, at least one surface contained in the housing having a solid precursor applied thereon, and a heating member for heating the solid precursor. Although the heating member may or may not be contained within the surface supporting or containing the solid precursor, the heating member is preferably contained in the surface or surfaces contained within the housing.

The present invention also provides for a method for vaporizing solid precursors. The method involves applying a solid precursor to a surface located within a housing having a sealed interior volume. The surface is then heated either directly or indirectly by a heating element until a sufficient temperature is reached to vaporize the solid precursor.

According to one embodiment of the present invention, the surface supporting or containing the solid precursor includes one or more heated baffles or rods. A heating member may be contained within the baffles or rods. Additionally, the baffles or rods may conform to the shape of the heating member. For example, the baffles or rods may be cone-shaped to fit tightly over conventional cone-shaped heaters.

According to another embodiment of the present invention, the surface for the solid precursor includes one or more heated meshes or gratings. A heating member may be contained within the mesh or grating. The mesh or grating may conform in shape to maximize flow through of carrier gas (for example, the mesh or grating may be s-shaped).

In a preferred embodiment of the present invention, the vaporized precursor is mixed with a carrier gas and delivered to a reaction chamber where the vaporized precursor is deposited on the surface of a substrate by conventional deposition methods.

With the foregoing and other objects, advantages and features of the invention that will become hereinafter apparent, the nature of the invention may be more clearly understood by reference to the following detailed description of the preferred embodiments of the invention and to the appended claims.

DETAILED DESCRIPTION OF THE INVENTION

Figure 1:
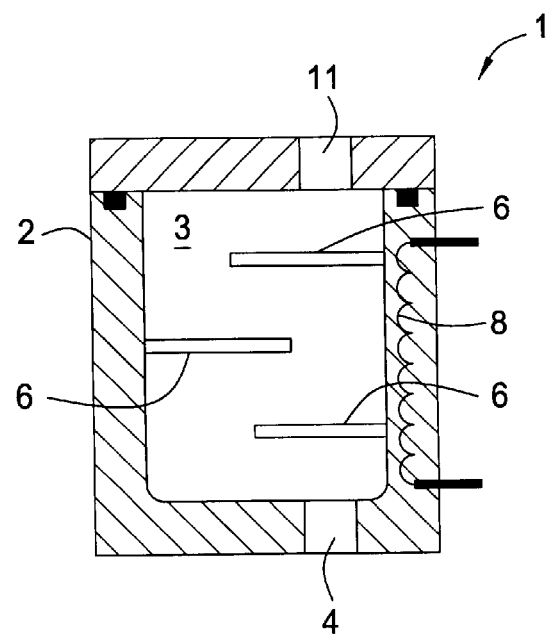
FIG. 1 is a cross-sectional view of an apparatus for vaporizing a solid precursor in accordance with a first embodiment of the present invention.

The present invention provides an apparatus and method for vaporizing solid precursors. Referring to FIG. 1, the apparatus 1 includes a housing 2 defining a sealed interior volume 3 having an inlet 4 for receiving a carrier gas located at one end of housing 2. At least one surface 6 for supporting or containing a solid precursor is contained within housing 2. Surface 6 is preferably located on walls adjacent to the wall containing inlet 4. In the embodiment shown in FIG. 1, a heating member 8 for heating a solid precursor applied to surface 6 is contained within at least one wall of housing 2. Optionally, an outlet 11 is provided on a wall of housing 2 opposite inlet 4. Preferably, outlet 11 is attached to a reaction chamber of a vapor deposition system.

Figure 2:
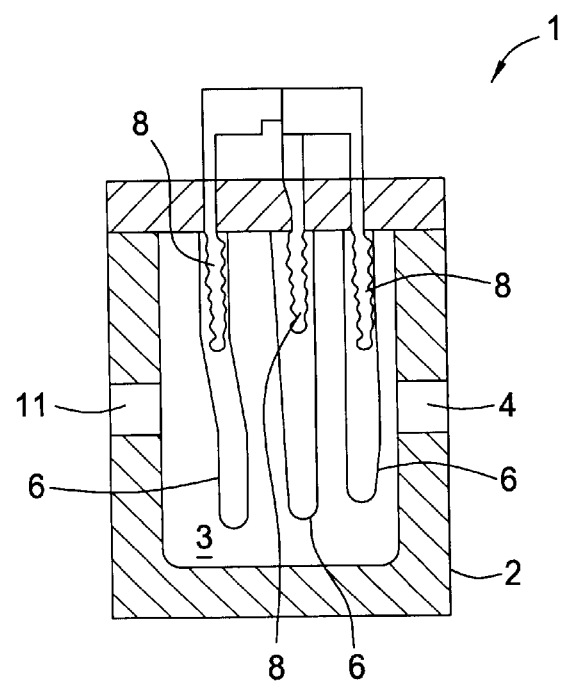
FIG. 2 is a cross-sectional view of an apparatus for vaporizing a solid precursor in accordance with a second embodiment of the present invention.

An alternate embodiment of the apparatus of the present invention is set forth in FIG. 2. In this embodiment, a housing 2 is provided that includes an inlet 4 on one wall of the housing for receiving a carrier gas and optionally an outlet 11 on the wall opposite inlet 4. At least one surface 6 for supporting or applying a solid precursor is located on a wall adjacent to the wall containing inlet 4. A heating member 8 is located in surface 6 for heating a solid precursor affixed to surface 6.

Figure 3:
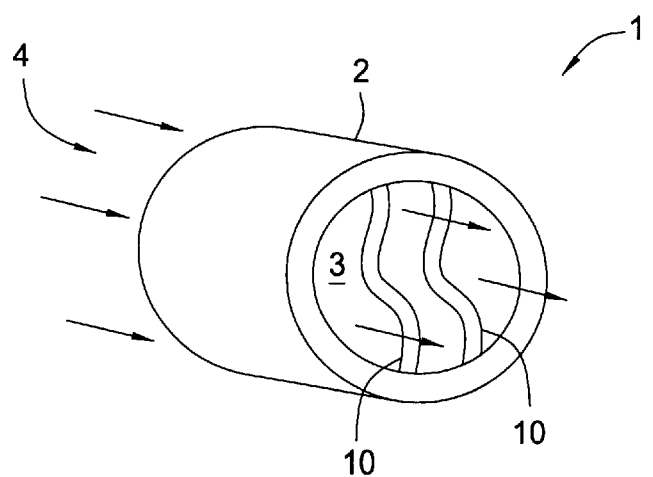
FIG. 3 is a cross-sectional view of an apparatus for vaporizing a solid precursor in accordance with a third embodiment of the present invention.
Figure 4:
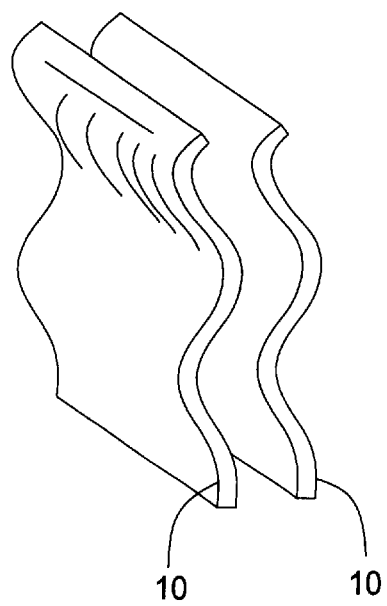
FIG. 4 is a side view of the heated mesh used in the apparatus shown in FIG. 3.

FIG. 3 shows another embodiment of the present invention. In particular, a housing 2 defining a sealed interior volume having an inlet 4 for receiving a carrier gas is provided. At least one surface for supporting a solid precursor is affixed to the walls of housing 2 and is formed of one or more heated meshes or gratings 10. The mesh or grating 10 shown in FIG. 3 is s-shaped to allow for maximum flow through of a carrier gas. FIG. 4 provides a more detailed view of the mesh or grating 10 used in the apparatus of FIG. 3. Similar to the embodiments set forth in FIGS. 1 and 2, heating member 8 may be contained in the walls of housing 2 (not shown). Alternatively, heating member 8 may be contained within mesh or grating 10 (not shown).

Figure 5:
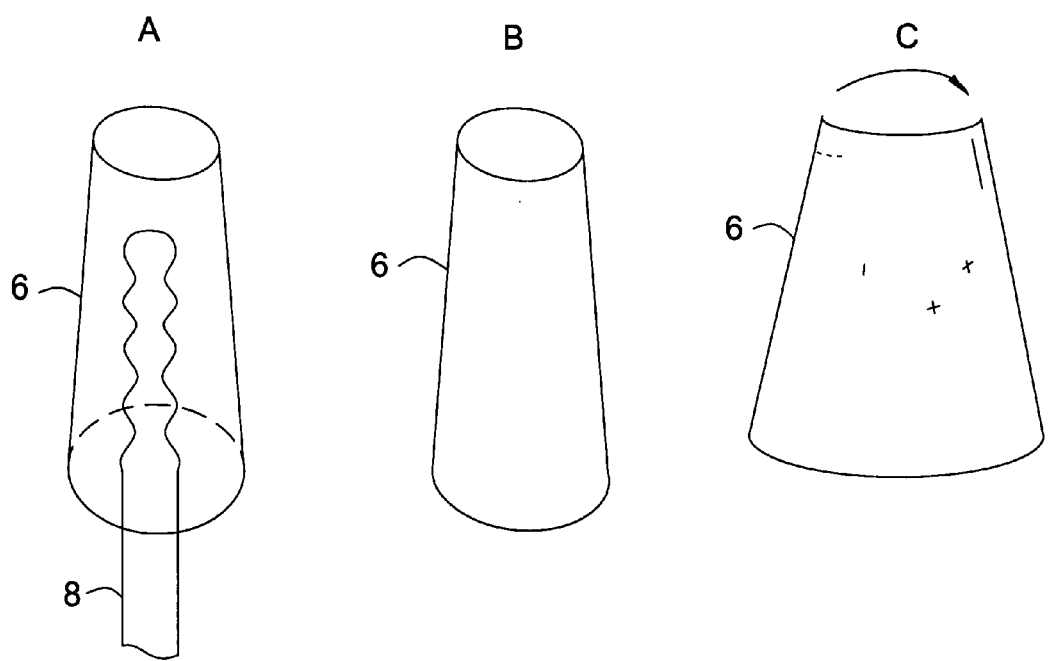
FIGS. 5A–5C are side views of a cone-shaped rod with heating member inside (FIG. 5A); a cone-shaped rod without heating member (FIG. 5B); and folded cone mesh with solid precursor pressed in between wire mesh (or grating) (FIG. 5C), respectively.

The s-shape of the mesh or grating shown as surface in FIG. 3 is not to be construed as limiting as other figures or shapes for surface 6 are within the scope of the invention. For example, if heating member 8 is contained within surface 6 which is formed of mesh or grating, surface 6 may be shaped to conform to the heating member. FIGS. 5A–5C depict surface 6 as a cone shaped rod that has been molded to conform to the shape of heating member 8. Typically, the shape chosen for surface 6 is one that provides the most surface area. By allowing more surface areas to be created in the same volume by applying solid precursor onto surface 6, i.e., mesh, grating, baffles, or rods as in the present invention, the solid precursor has from about 100× to about 1000× more surface area to vaporize. This allows for a more efficient and faster vaporization. Additionally, with the help of the carrier gas, the flow of vapor through the housing can be better controlled.

Surface 6 is typically formed of a substance that can withstand the high temperatures needed to vaporize the solid precursors. Suitable examples of materials forming surface 6 include stainless steel and ceramics. Further, surface 6 may be in a staggered configuration as shown in FIG. 1, or in a flush (or even) configuration as shown in FIG. 2.

Any known solid precursor typically used in the production of semiconductor wafers can be used. Suitable preferred examples include $W(CO)_6$ and $TaO_x$ precursors. The solid precursor may be applied to the surface by any means that will permit it to remain thereon. For example, the solid precursor may be pressed onto the surface to increase surface area for vaporization. This is an improvement over prior apparatus and methods, where vaporization was limited to the top surfaces of a solid material located in the bottom of a container. Alternatively, solid precursors may be dissolved in solution and the heating element may be dipped into the solution. After it is allowed to dry, the solid is retained on the heating element. A rough surface on the heating element may improves adhesion of the solid precursor to the heating element.

In previous systems, when the carrier gas was blown through the powdered solid precursor, the gas picked up some of the loose precursor particles and carried the loose particles out onto the wafer surface, thereby contaminating the wafer. However, in the present invention, the use of surface 6 to hold the solid precursor permits better handling of the solid material, thereby reducing the risk of the solid material flowing with the carrier gas out into the reaction chamber.

To vaporize a solid precursor using the apparatus set forth in FIG. 1, a solid precursor is first applied to surface 6. The said precursor can be applied by pressing the precursor onto surface 6 or by "dipping" the heating element into the dissolved precursor as discussed above. The solid precursor is then heated, either directly by heating member 8 located inside surface 6, or indirectly by heating element 8 located inside the walls of housing 2, until a temperature high enough to vaporize the solid precursor is reached. The vaporization temperature will vary depending on the solid substrate applied to surface 6. A carrier gas enters housing 2 through inlet 4 and carries the vaporized solid precursor to a reaction chamber (not shown) via outlet 11. Once the vaporized precursor reaches the reaction chamber, it is deposited onto the surface of a substrate (e.g., semiconductor wafer) by conventional deposition methods such as atomic layer deposition (ALD), chemical vapor deposition methods (CVD), and evaporative coating (i.e., the redeposition of substance from precursor onto wafer or substrate).

The invention of this application is described above both generically, and with regard to specific embodiments. A wide variety of alternatives known to those of ordinary skill in the art can be selected within the generic disclosure, and examples are not to be interpreted as limiting, unless specifically so indicated. The invention is not otherwise limited, except for the recitation of the claims set forth below.

Although the invention has been described with some particularity with respect to preferred embodiments thereof, many changes could be made and many alternative embodiments could thus be derived without departing from the scope of the invention.

What is claimed is:

1. An apparatus for vaporizing a solid precursor, comprising:
    a housing defining an interior volume having an inlet for receiving a carrier gas; and
    at least two surfaces contained in the housing having the solid precursor applied thereto, wherein each of the at least two surfaces comprises a heating member for heating the solid precursor and the at least two surfaces are spaced to allow passage of the carrier gas therebetween.

2. The apparatus of claim 1, wherein the apparatus further comprises an outlet operably connected to a reaction chamber of a deposition chamber.

3. The apparatus of claim 2, wherein the at least two surfaces are selected from the group consisting of a baffle, a rod, a mesh and a grating.

4. The apparatus of claim 1, wherein the at least two surfaces have a form selected from the group consisting of an s-shape, a linear shape and a cone shape.

5. The apparatus of claim 3, wherein the at least two surfaces are formed of a material selected from the group consisting of stainless steel and ceramic.

6. The apparatus of claim 1, wherein the solid precursor includes $TaO_x$ precursors.

7. The apparatus of claim 2, wherein the deposition chamber is selected from the group consisting of ALD chambers, CVD chambers, and evaporative coating chambers.

* * * * *